US011145355B2

(12) United States Patent
Kim et al.

(10) Patent No.: US 11,145,355 B2
(45) Date of Patent: Oct. 12, 2021

(54) CALIBRATION CIRCUIT FOR CONTROLLING RESISTANCE OF OUTPUT DRIVER CIRCUIT, MEMORY DEVICE INCLUDING THE SAME, AND OPERATING METHOD OF THE MEMORY DEVICE

(71) Applicant: SAMSUNG ELECTRONICS CO., LTD., Suwon-si (KR)

(72) Inventors: Hwapyong Kim, Uijeongbu-si (KR); Hundae Choi, Hwaseong-si (KR); Junha Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/822,164

(22) Filed: Mar. 18, 2020

(65) Prior Publication Data

US 2021/0027827 A1    Jan. 28, 2021

(30) Foreign Application Priority Data

Jul. 25, 2019   (KR) .................... 10-2019-0090494

(51) Int. Cl.
*G11C 11/408*      (2006.01)
*G11C 11/4096*     (2006.01)
(Continued)

(52) U.S. Cl.
CPC ........ *G11C 11/4085* (2013.01); *G11C 7/1051* (2013.01); *G11C 7/1078* (2013.01);
(Continued)

(58) Field of Classification Search
CPC ............ G11C 11/4085; G11C 11/4096; G11C 7/1078; G11C 7/1051; G11C 2207/2254; H03K 19/0005
See application file for complete search history.

(56) References Cited

U.S. PATENT DOCUMENTS 7,646,212 B2   1/2010   Sung et al.
7,773,440 B2   8/2010   Kim et al.
(Continued)

FOREIGN PATENT DOCUMENTS

KR   10-0834330   5/2008
KR   10-0862316   10/2008
(Continued)

*Primary Examiner* — David Lam
(74) *Attorney, Agent, or Firm* — F. Chau & Associates, LLC

(57) ABSTRACT

A memory device includes a calibration circuit having a pull-up code generator including a pull-up resistor block and generating a pull-up code, and a pull-down code generator including a replica pull-up resistor block and a pull-down resistor block and generating a pull-down code, and an off chip driver/on die termination circuit providing a termination resistance having a resistance value set by the calibration circuit in a data reception operation and outputting data at an output strength set by the calibration circuit in a data output operation. In a calibration operation, a resistance value of the replica pull-up resistor block is adjusted to be less than a resistance value of the pull-up resistor block, and the pull-down code has a code value by which a resistance value of the pull-down resistor block corresponds to the resistance value of the replica pull-up resistor block.

19 Claims, 14 Drawing Sheets

(51) Int. Cl.
  *G11C 7/10*     (2006.01)
  *H03K 19/00*    (2006.01)
(52) U.S. Cl.
  CPC ...... *G11C 11/4096* (2013.01); *H03K 19/0005* (2013.01); *G11C 2207/2254* (2013.01)

(56) References Cited

U.S. PATENT DOCUMENTS

| | | |
|---|---|---|
| 7,786,753 B2 | 8/2010 | Jeong et al. |
| 7,839,159 B2 | 11/2010 | Nakamura et al. |
| 7,969,182 B2 | 6/2011 | Kim et al. |
| 7,977,968 B2 | 7/2011 | Kim et al. |
| 8,334,706 B2 | 12/2012 | Moon |
| 8,508,251 B2 * | 8/2013 | Choi .................. H03K 19/0005 326/30 |
| 8,649,229 B2 | 2/2014 | Vergis et al. |
| 8,929,119 B2 | 1/2015 | Lee et al. |
| 2009/0146685 A1 * | 6/2009 | Kim .................. H03K 19/0005 326/33 |
| 2015/0348603 A1 * | 12/2015 | Lee ...................... G11C 29/028 365/189.07 |
| 2017/0099050 A1 | 4/2017 | Lee et al. |

FOREIGN PATENT DOCUMENTS

| | | |
|---|---|---|
| KR | 10-2010-0003602 | 1/2010 |
| KR | 10-2010-0027777 | 3/2010 |
| KR | 10-2011-0013704 | 2/2011 |
| KR | 10-1206498 | 11/2012 |

* cited by examiner

CALIBRATION CIRCUIT FOR CONTROLLING RESISTANCE OF OUTPUT DRIVER CIRCUIT, MEMORY DEVICE INCLUDING THE SAME, AND OPERATING METHOD OF THE MEMORY DEVICE

CROSS-REFERENCE TO RELATED APPLICATION

This application claims priority under 35 U.S.C. § 119 to Korean Patent Application No. 10-2019-0090494, filed on Jul. 25, 2019 in the Korean Intellectual Property Office, the disclosure of which is incorporated by reference herein in its entirety.

TECHNICAL FIELD

Exemplary embodiments of the inventive concept relate to a memory device, and, more particularly, to a calibration circuit for controlling a resistance of an output driver circuit, a memory device including the same, and an operating method of the memory device.

DISCUSSION OF RELATED ART

Capacities and speeds of semiconductor memory devices widely used in high-performance electronic systems have increased over time. Dynamic random access memory (DRAM), as one example of a memory device, is a volatile memory and determines data by charges stored in a capacitor.

To prevent distortion of a signal transmitted between a memory controller and a memory device, an on die termination (ODT) circuit and/or an off chip driver (OCD) circuit may be included in the memory device. A resistance (or impedance) of the ODT/OCT circuit is controlled by a control code generated by a calibration circuit. The calibration circuit performs a ZQ calibration operation to generate, as the control code, pull-up and pull-down codes varying according to conditions including process, voltage, temperature (PVT), or the like. In this case, an ODT resistance value, which is provided when data is received, and a resistance value of the OCD circuit, which determines an output strength when data is output, may be optimized for signal characteristic improvement.

SUMMARY

According to an exemplary embodiment of the inventive concept, a memory device includes a calibration circuit having a pull-up code generator including a pull-up resistor block and configured to generate a pull-up code, and a pull-down code generator including a replica pull-up resistor block and a pull-down resistor block and configured to generate a pull-down code, and an off chip driver (OCD)/on die termination (ODT) circuit configured to provide a termination resistance having a resistance value set by the calibration circuit in a data reception operation and to output data at an output strength set by the calibration circuit in a data output operation. In a calibration operation, a resistance value of the replica pull-up resistor block is adjusted to be less than a resistance value of the pull-up resistor block, and the pull-down code has a code value by which a resistance value of the pull-down resistor block corresponds to the resistance value of the replica pull-up resistor block.

According to an exemplary embodiment of the inventive concept, a calibration circuit configured to control an off chip driver (OCD)/on die termination (ODT) circuit includes a pull-up resistor block connected to an external calibration resistor through a pad and including at least one pull-up resistor set each connected to a power source voltage, a first code generator configured to generate a pull-up code for controlling a pull-up circuit in the OCD/ODT circuit, based on a comparison operation comparing a voltage of one node of the pull-up resistor block and a calibration reference voltage, a replica pull-up resistor block including a plurality of pull-up resistor sets connected to the power source voltage, a pull-down resistor block including a pull-down resistor set connected to a ground voltage, and a second code generator configured to generate a pull-down code for controlling a pull-down circuit in the OCD/ODT circuit, based on a comparison operation comparing a voltage of a node between the replica pull-up resistor block and the pull-down resistor block and the calibration reference voltage. In a calibration operation, when a number of enabled pull-up resistor sets in the pull-up resistor block differs from a number of enabled pull-up resistor sets in the replica pull-up resistor block, the pull-up code and the pull-down code have code values by which the pull-up circuit and the pull-down circuit in the OCD/ODT circuit are set to have different resistance values.

According to an exemplary embodiment of the inventive concept, an operating method of a memory device includes entering a calibration mode, generating a pull-up code such that a resistance value of a pull-up resistor block has a value corresponding to an external calibration resistor, through a pull-up code generator connected to the external calibration resistor and the pull-up resistor block during a first calibration operation, generating a pull-down code such that a resistance value of a pull-down resistor block has a value corresponding to a resistance value of a replica pull-up resistor block which receives the pull-up code, through a pull-down code generator connected to a node between the replica pull-up resistor block and the pull-down resistor block during a second calibration operation, and providing the pull-up code and the pull-down code to a pull-up circuit and a pull-down circuit, respectively, in an off chip driver (OCD)/on die termination (ODT) circuit, after the calibration mode ends. A code value of the pull-down code varies according to a change in the resistance value of the replica pull-up resistor block.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EXEMPLARY EMBODIMENTS

Figure 1:
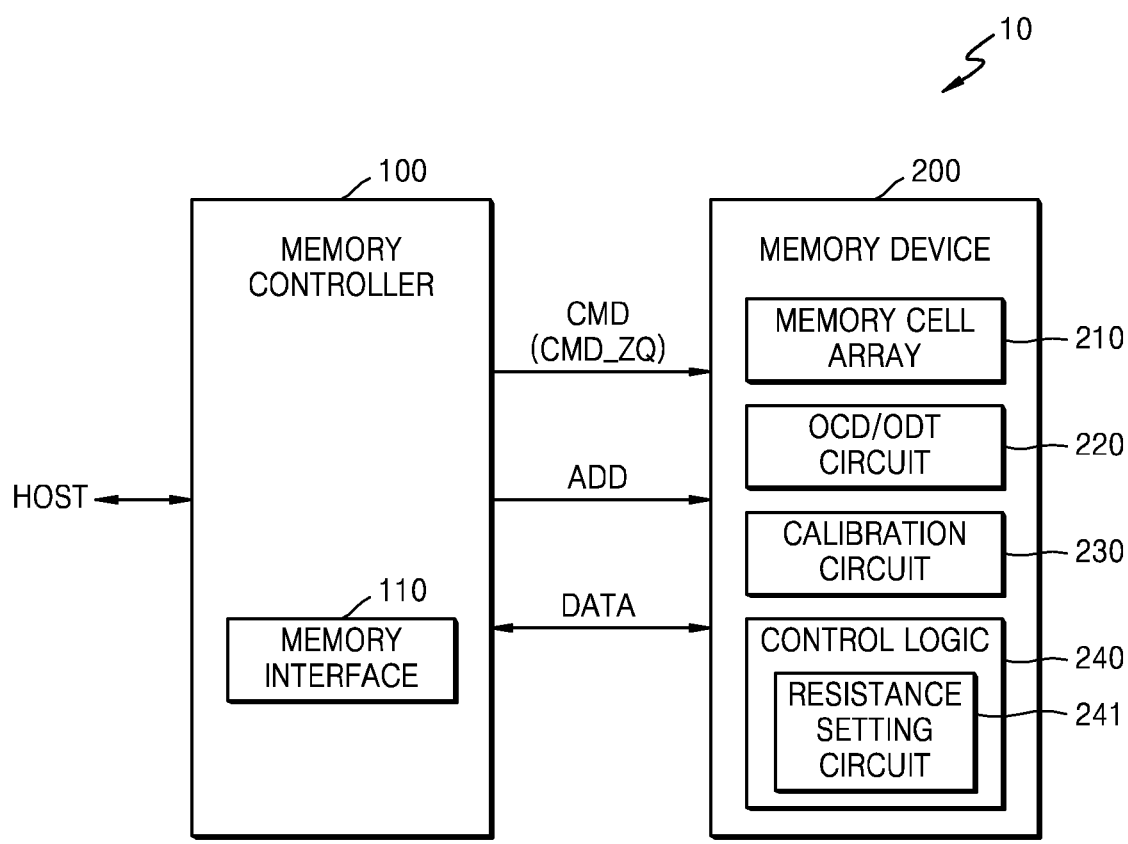
FIG. 1 is a block diagram of a memory system according to an exemplary embodiment of the inventive concept.

Exemplary embodiments of the inventive concept provide a calibration circuit for performing a calibration operation capable of improving signal characteristics when data is output, a memory device including the same, and an operating method of the memory device.

Hereinafter, exemplary embodiments of the inventive concept will be described in detail with reference to the accompanying drawings. Like reference numerals may refer to like elements throughout this application.

FIG. 1 is a block diagram of a memory system according to an exemplary embodiment of the inventive concept.

Referring to FIG. 1, a memory system 10 may include a memory controller 100 and a memory device 200. The memory controller 100 provides various types of signals to the memory device 200 to control memory operations such as write and read operations. For example, the memory controller 100 includes a memory interface 110 and provides a command CMD and an address ADD to the memory device 200 to access data DATA in a memory cell array 210.

The command CMD may include a command for normal memory operations such as write and read operations. In addition, the memory controller 100 may provide the command CMD for various types of control operations in the memory device 200, for example, provide a calibration command CMD_ZQ to the memory device 200. The memory device 200 may set a termination resistance value of an on die termination (ODT) circuit in the memory device 200 or a resistance value of an off chip driver (OCD) circuit, by performing a calibration operation in an initial operation or in response to the calibration command CMD_ZQ.

The memory controller 100 may access the memory device 200 in response to a request from a host. The memory controller 100 may communicate with the host by using various protocols, e.g., an interface protocol such as peripheral component interconnect-express (PCI-E), advanced technology attachment (ATA), serial ATA (SATA), parallel ATA (PATA), or serial attached small computer system interface (SCSI) (SAS). Other additional various interface protocols such as universal serial bus (USB), multi-media card (MMC), enhanced small disk interface (ESDI), or integrated drive electronics (IDE) may be applied between the host and the memory controller 100.

The memory device 200 may include various types of memories, and for example, the memory device 200 may include dynamic random access memory (DRAM) such as double data rate synchronous dynamic random access memory (DDR SDRAM), low power double data rate (LPDDR) SDRAM, graphics double data rate (GDDR) SDRAM, or Rambus dynamic random access memory (RDRAM). However, the inventive concept is not limited thereto, and for example, the memory device 200 may include a nonvolatile memory such as a flash memory, magnetic RAM (MRAM), ferroelectric RAM (FRAM), phase change RAM (PRAM), or resistive RAM (ReRAM).

The memory device 200 may communicate with the memory controller 100 through interfaces according to various standards. For example, the memory controller 100 and the memory device 200 may be interfaced according to low power double data rate 4 (LPDDR4), LPDDR4X, LPDDR5, or other various types of standards.

The memory device 200 may include the memory cell array 210, an OCD/ODT circuit 220, a calibration circuit 230, and a control logic 240. The OCD/ODT circuit 220 may include an OCD circuit and/or an ODT circuit. According to an exemplary embodiment of the inventive concept, in the memory device 200, the OCD circuit and the ODT circuit may be separately implemented. Alternatively, according to an exemplary embodiment of the inventive concept, the OCD circuit may include a pull-up circuit and a pull-down circuit, and any one of the pull-up circuit and the pull-down circuit may be used as the ODT circuit. For example, in a data output operation, the OCD circuit may perform a signal output operation using the pull-up circuit and the pull-down circuit, and in a data reception operation, the pull-up circuit of the OCD circuit may be used as the ODT circuit to provide a termination resistance to a line through which the data DATA is input.

As described above, the OCD circuit and the ODT circuit may be implemented according to various manners, and thus, the OCD/ODT circuit 220 may include various components. In the exemplary embodiments of the inventive concept below, the OCD circuit and the ODT circuit are separately implemented for convenience of description, but as described above, the ODT circuit may correspond to a partial configuration of the OCD circuit.

The calibration circuit 230 generates various types of control codes for adjusting a resistance value of the OCD/ODT circuit 220. For example, the calibration circuit 230 performs a calibration operation in an initial operation of the memory device 200 or according to periodically entering a calibration mode. In the calibration operation, the various types of control codes may be generated based on a feedback operation. For example, the calibration circuit 230 may include resistor circuits having substantially the same characteristics as a pull-up resistor and a pull-down resistor included in the OCD/ODT circuit 220, generate a pull-up code for adjusting a resistance value of the pull-up circuit in the OCD/ODT circuit 220, and generate a pull-down code for adjusting a resistance value of the pull-down circuit in the OCD/ODT circuit 220. The generated pull-up code and pull-down code are set or stored in the memory device 200 and may be thereafter used to provide an ODT resistance in a data write and read operation or to adjust a resistance value (or an output strength) of the OCD circuit (or output driver circuit).

The control logic 240 may perform various types of control operations associated with a memory operation of the memory device 200 and also provide various control signals to components in the memory device 200. According to an exemplary embodiment of the inventive concept, the control logic 240 may include a resistance setting circuit 241, the resistance setting circuit 241 may be used to generate the above-described pull-up code and pull-down code in a calibration operation, and a code value of at least one of the pull-up code and the pull-down code may be changed based on control of the resistance setting circuit 241. In other words, when values of the pull-up code and the pull-down code are changed, an output strength of the OCD circuit may be changed in a data output operation, thus improving a data signal characteristic.

For example, the pull-up circuit in the OCD/ODT circuit 220 may include a plurality of first switches controlled in response to the pull-up code and a plurality of pull-up resistors arranged in correspondence to the plurality of first switches. In addition, the pull-down circuit in the OCD/ODT circuit 220 may include a plurality of second switches controlled in response to the pull-down code and a plurality of pull-down resistors arranged in correspondence to the plurality of second switches.

The calibration circuit 230 may include resistor circuits having substantially the same characteristics as the pull-up resistors and the pull-down resistors in the OCD/ODT circuit 220. For example, the calibration circuit 230 may include one or more pull-up resistor sets, and each pull-up resistor set may include substantially the same configuration as the pull-up circuit in the OCD/ODT circuit 220. In addition, the calibration circuit 230 may include one or more pull-down resistor sets, and each pull-down resistor set may include substantially the same configuration as the pull-down circuit in the OCD/ODT circuit 220.

In addition, the calibration circuit 230 may include a plurality of replica pull-up resistor sets having substantially the same characteristic as the pull-down resistor set (or the pull-up circuit in the OCD/ODT circuit 220). According to an exemplary embodiment of the inventive concept, a resistance value of replica pull-up resistor sets may be changed according to the number of replica pull-up resistor sets enabled in a calibration operation, and accordingly, a code value of at least one of the pull-up code and the pull-down code may be changed.

For example, when the pull-up code and the pull-down code are generated by using a certain number of pull-up resistor sets, pull-down resistor sets, and replica pull-up resistor sets, a resistance value of the pull-up circuit in the OCD/ODT circuit 220 may be substantially the same as a resistance value of the pull-down circuit in the OCD/ODT circuit 220 through a calibration operation. In addition, a resistor configuration of the pull-up circuit in the OCD/ODT circuit 220 is implemented to be substantially the same as a resistor configuration of the pull-down circuit in the OCD/ODT circuit 220, the pull-up code and the pull-down code may have a same code value.

Otherwise, when the number of pull-up resistor sets to generate the pull-up code differs from the number of replica pull-up resistor sets to generate the pull-down code, the pull-up code and the pull-down code may have different code values, and a resistance value of the pull-up circuit in the OCD/ODT circuit 220 may differ from a resistance value of the pull-down circuit in the OCD/ODT circuit 220. For example, in a calibration operation, a resistance value of the pull-down circuit in the OCD/ODT circuit 220 may decrease by adjusting the number of replica pull-up resistor sets enabled, and accordingly, in a data output operation, a slew rate of a signal to a logic low level may increase, and a data read margin may be improved.

According to the exemplary embodiment described above, when data is output through the OCD/ODT circuit 220, resistance values of the pull-up circuit and the pull-down circuit in the OCD circuit as an output driver circuit may be optimized, and an eye window of the data output through the OCD/ODT circuit 220 may be improved. For example, when resistance values of the pull-up circuit and/or the pull-down circuit in the OCD circuit decrease, a swing level width of a signal increases, and accordingly, a data margin may be improved.

An operation of setting a resistance value of the OCD/ODT circuit 220 by adjusting a resistance value in the calibration circuit 230 may be controlled by the resistance setting circuit 241. As an operation example, the memory controller 100 may provide information related to resistance setting of the OCD/ODT circuit 220 to the memory device 200, and the resistance setting circuit 241 may perform the above-described control operation based on the information from the memory controller 100. Alternatively, optimal resistance values of the pull-up circuit and/or the pull-down circuit in the OCD/ODT circuit 220 may be calculated through a test operation in a manufacturing process of the memory device 200, information about the calculated resistance values may be previously stored in the memory device 200, and the above-described control operation may be performed based on the stored information.

Although an example in which a resistance value of the OCD/ODT circuit 220 is changed by adjusting the number of replica pull-up resistor sets enabled has been described in the above exemplary embodiment, the inventive concept is not limited thereto. According to an exemplary embodiment of the inventive concept, the calibration circuit 230 may include a plurality of pull-down resistor sets, and resistance values of the pull-up circuit and/or the pull-down circuit in the OCD/ODT circuit 220 may be changed by also adjusting the number of pull-down resistor sets enabled.

Figure 2:
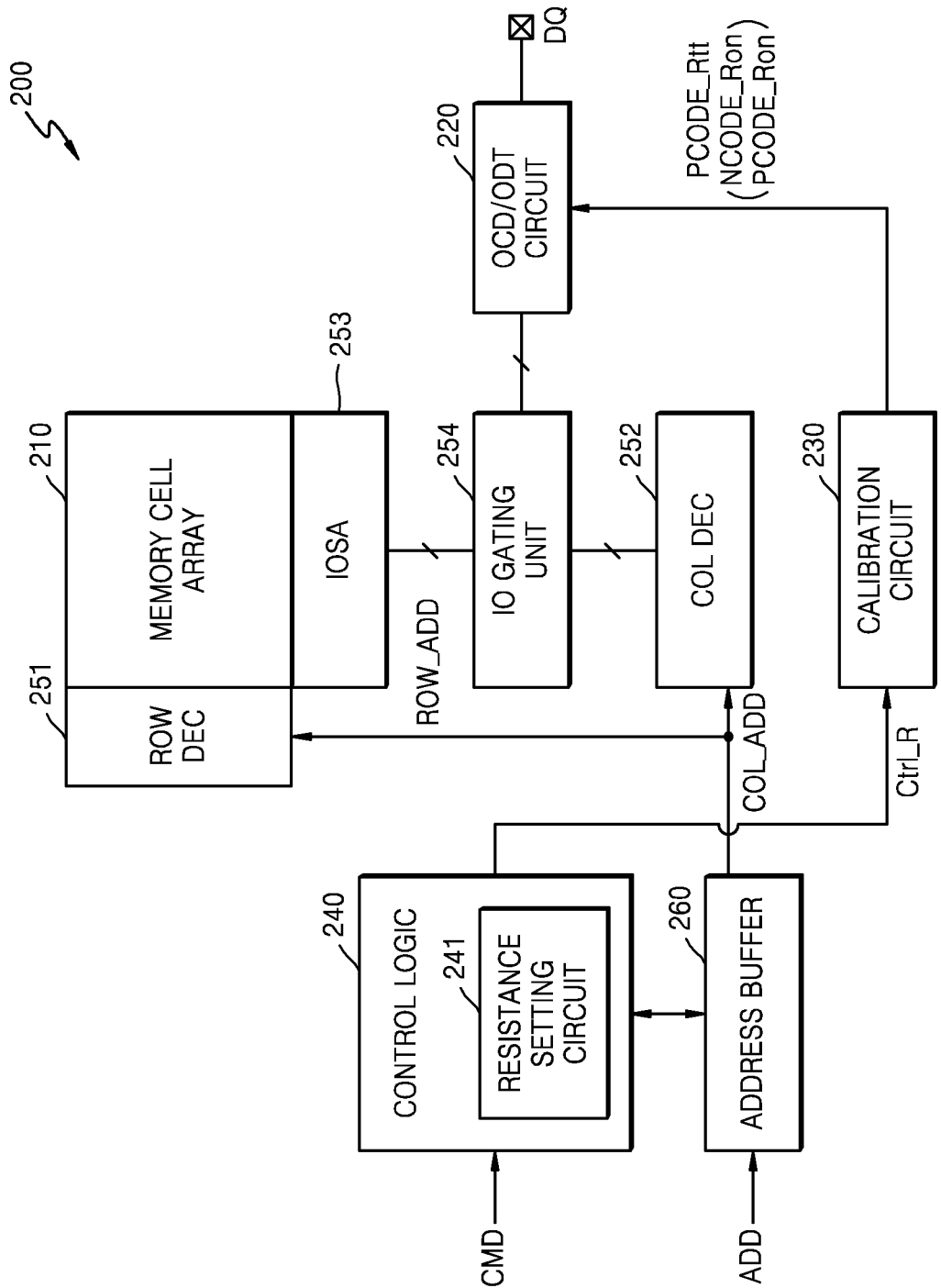
FIG. 2 is a block diagram of a memory device shown in FIG. 1 according to an exemplary embodiment of the inventive concept.

FIG. 2 is a block diagram of a memory device shown in FIG. 1 according to an exemplary embodiment of the inventive concept.

The memory device 200 may include the memory cell array 210, the OCD/ODT circuit 220, the calibration circuit 230, the control logic 240, and an address buffer 260. Although FIGS. 1 and 2 show an example in which the resistance setting circuit 241 is included in the control logic 240, the inventive concept is not limited thereto, and the resistance setting circuit 241 may be provided outside the control logic 240.

For a memory operation, the memory device 200 may further include other various components. For example, the memory device 200 may further include a row decoder 251 for selecting a row, a column decoder 252 for selecting a column, an input-output sense amplifier (IOSA) 253, and an input-output gating unit 254 configured to perform gating of input/output data DATA.

The address buffer 260 may receive the address ADD provided from the memory controller 100. The address ADD may include a row address ROW_ADD for indicating a row of the memory cell array 210 and a column address COL_ADD for indicating a column of the memory cell array 210. The input-output gating unit 254 may provide read data from the memory cell array 210 to the outside through the OCD/ODT circuit 220. In addition, an input buffer may be disposed inside or outside the OCD/ODT circuit 220, and in a data write operation, data may be provided to the memory cell array 210 through the input buffer and the input-output gating unit 254.

The OCD/ODT circuit 220 may be used as an output driver circuit in a data output operation and may provide a termination resistance to a signal transmission path through an input-output pad DQ in a data input operation. According to the above-described exemplary embodiment, the OCD/ODT circuit 220 may include the OCD circuit including the pull-up circuit and the pull-down circuit, and the ODT circuit may correspond to any one of the pull-up circuit and the pull-down circuit in the OCD circuit. In addition, the calibration circuit 230 may provide a first pull-up code PCODE_Rtt for setting a termination resistance value of the ODT circuit, a second pull-up code PCODE_Ron for setting a resistance value of the pull-up circuit in the OCD circuit, and a pull-down code NCODE_Ron for setting a resistance value of the pull-down circuit in the OCD circuit. Although FIG. 2 shows an example in which the first pull-up code PCODE_Rtt differs from the second pull-up code PCODE_Ron, according to exemplary embodiments of the inventive concept, the first pull-up code PCODE_Rtt and the second pull-up code PCODE_Ron may correspond to a same code (e.g., the pull-up code).

According to an exemplary embodiment of the inventive concept, the calibration circuit 230 may include one or more pull-up resistor sets, one or more pull-down resistor sets, and a plurality of replica pull-up resistor sets, and the number of pull-up resistor sets used in a calibration operation may be set to be different from the number of replica pull-up resistor sets. For example, the control logic 240 may provide an enable control signal Ctrl_R to the calibration circuit 230, and the number of replica pull-up resistor sets enabled in a calibration operation may be adjusted. In addition, according to a resistance value changed by adjusting the number of replica pull-up resistor sets, a code value of the pull-down code NCODE_Ron provided to the pull-down resistor set may be changed, and for example, the pull-down code NCODE_Ron for decreasing a resistance value of the OCD circuit may be generated.

Figure 3A:
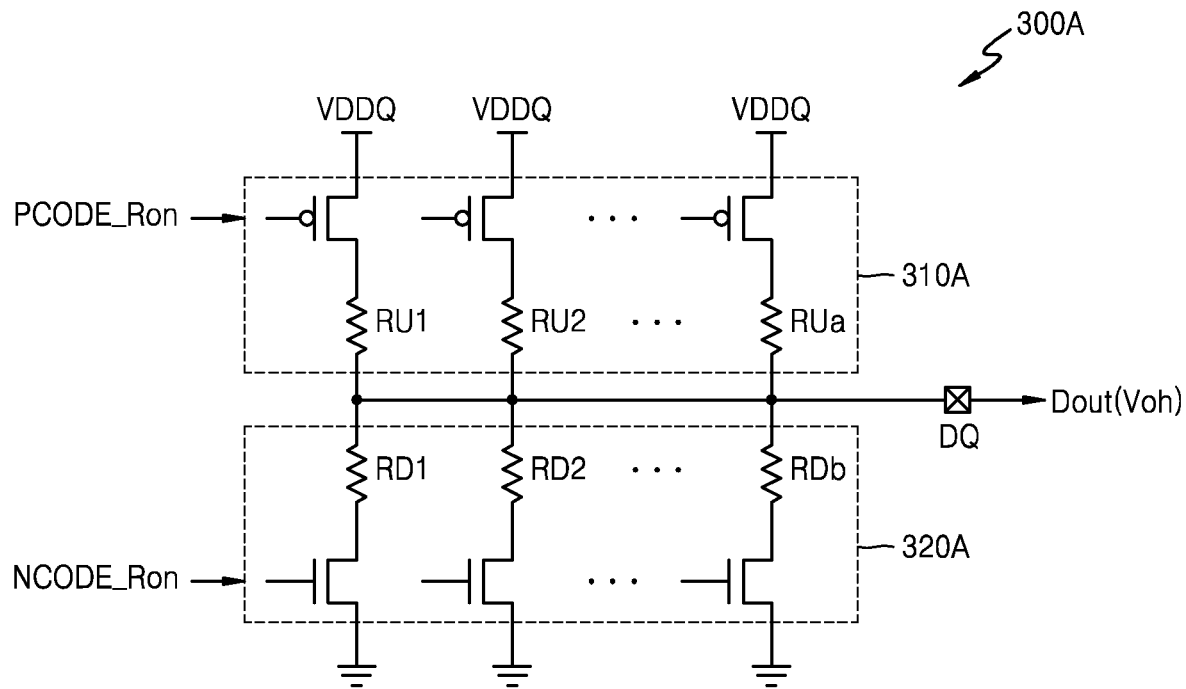
FIGS. 3A, 3B and 4 are circuit diagrams of an off chip driver (OCD)/on die termination (ODT) circuit according to exemplary embodiments of the inventive concept.
Figure 3B:
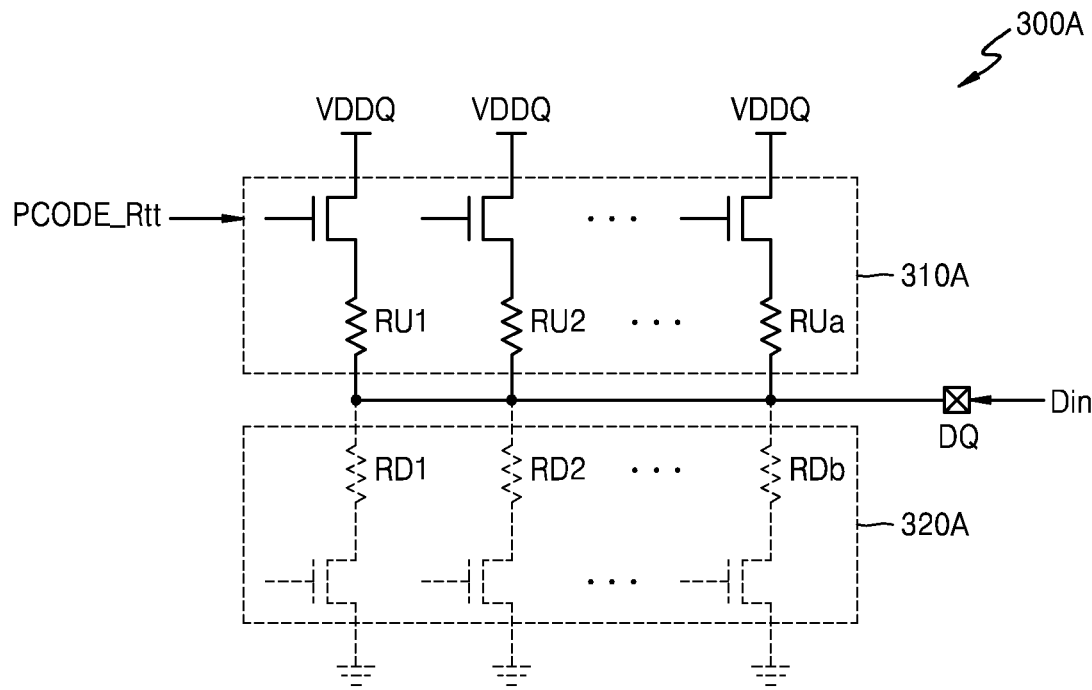
Figure 4:
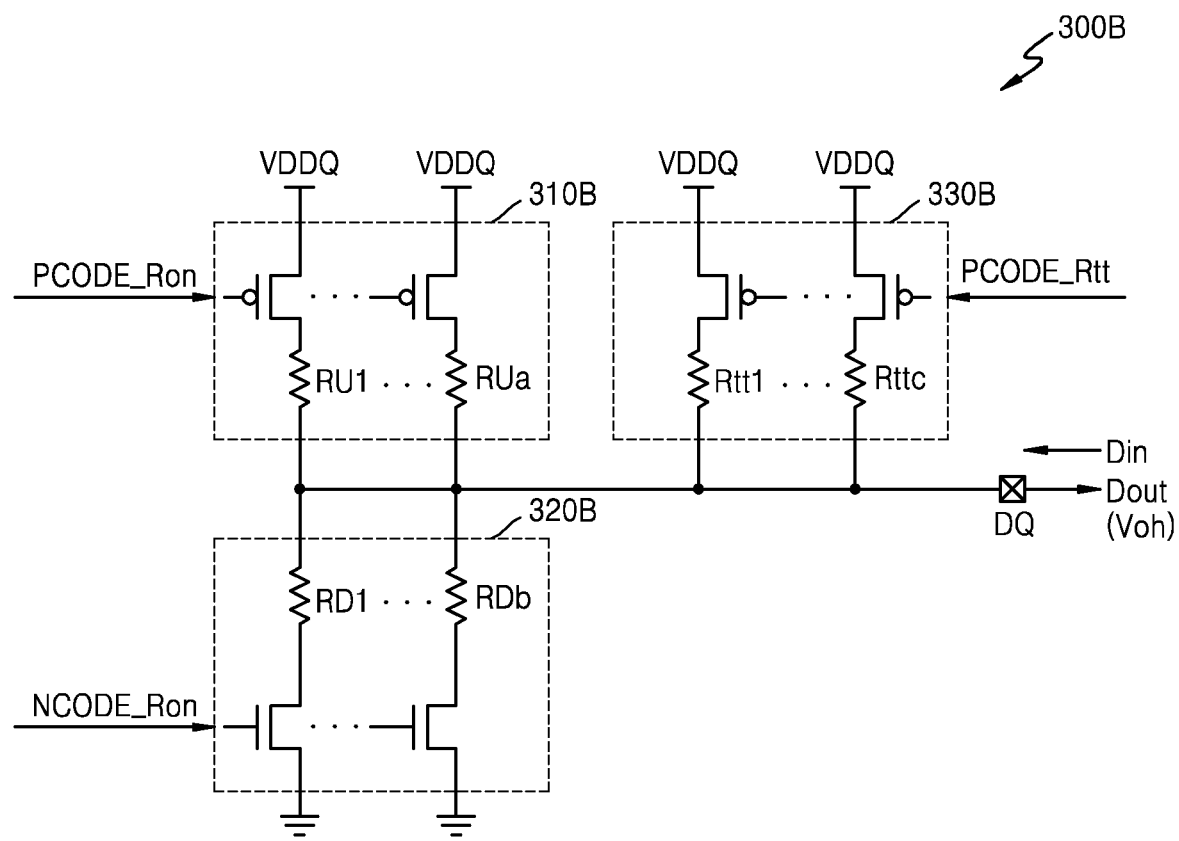

FIGS. 3A, 3B, and 4 are circuit diagrams of an OCD/ODT circuit according to exemplary embodiments of the inventive concept. FIGS. 3A and 3B illustrate an example in which a partial configuration of an OCD circuit is used as an ODT circuit, and FIG. 4 illustrates an example in which an OCD circuit is separately implemented from an ODT circuit.

Referring to FIG. 3A, an OCD/ODT circuit 300A may include a pull-up circuit 310A and a pull-down circuit 320A, and the pull-up circuit 310A may include a plurality of positive-channel metal-oxide semiconductor (PMOS) transistors connected to a power source voltage VDDQ and arranged in parallel to one another and a plurality of pull-up resistors, e.g., pull-up resistors RU1 to RUa arranged in correspondence to the plurality of PMOS transistors. In addition, the pull-down circuit 320A may include a plurality of negative-channel metal-oxide semiconductor (NMOS) transistors connected to a ground voltage and arranged in parallel to one another and a plurality of pull-down resistors, e.g., pull-down resistors RD1 to RDb arranged in correspondence to the plurality of NMOS transistors. In a data output operation, the OCD/ODT circuit 300A may generate output data Dout having a logic high level corresponding to Voh. Although FIG. 3A shows that the pull-up circuit 310A includes the PMOS transistors and the pull-down circuit 320A includes the NMOS transistors, the inventive concept is not limited thereto. For example, each of the pull-up circuit 310A and the pull-down circuit 320A may include NMOS transistors or PMOS transistors or include both NMOS transistors and PMOS transistors.

FIG. 3A shows an example in which the OCD/ODT circuit 300A is used as an output driver circuit, the second pull-up code PCODE_Ron in the above-described exemplary embodiment may be provided to the pull-up circuit 310A, and the pull-down code NCODE_Ron in the above-described exemplary embodiment may be provided to the pull-down circuit 320A. For example, when read data is output, the PMOS transistors in the pull-up circuit 310A may have on/off states corresponding to the second pull-up code PCODE_Ron and have resistance values according to the on/off states. In addition, the NMOS transistors in the pull-down circuit 320A may have on/off states corresponding to the pull-down code NCODE_Ron and have resistance values according to the on/off states.

Referring to FIG. 3B, the OCD/ODT circuit 300A may be used as an ODT resistor when input data is received, and for example, all of the NMOS transistors in the pull-down circuit 320A may be turned off when input data Din is received. In addition, the PMOS transistors in the pull-up circuit 310A may have on/off states corresponding to the first pull-up code PCODE_Rtt and have resistance values according to the on/off states.

Referring to FIG. 4, an OCD/ODT circuit 300B may include OCD circuits 310B and 320B and an ODT circuit 330B. For example, the OCD circuits 310B and 320B may include a pull-up circuit 310B and a pull-down circuit 320B, and the OCD circuits 310B and 320B may be implemented to be substantially the same as the OCD/ODT circuit 300A shown in FIGS. 3A and 3B. In addition, the ODT circuit 330B may include a plurality of PMOS transistors connected to the power source voltage VDDQ and arranged in parallel to one another and a plurality of termination resistors, e.g., termination resistors Rtt1 to Rttc arranged in correspondence to the plurality of PMOS transistors. For example, when the output data Dout is provided, the OCD circuits 310B and 320B may operate, and when the input data Din is received, the ODT circuit 330B may operate. According to an exemplary embodiment of the inventive concept, the ODT circuit 330B may be implemented to be substantially the same as the pull-up circuit 310B in the OCD circuits 310B and 320B.

The pull-up resistors RU1 to RUa, the pull-down resistors RD1 to RDb, and the termination resistors Rtt1 to Rttc, as well as transistors as switches corresponding to the resistors are shown as an example in FIGS. 3A, 3B, and 4. However, the inventive concept is not limited thereto, and the numbers of resistors and switches may be variously determined.

Figure 5:
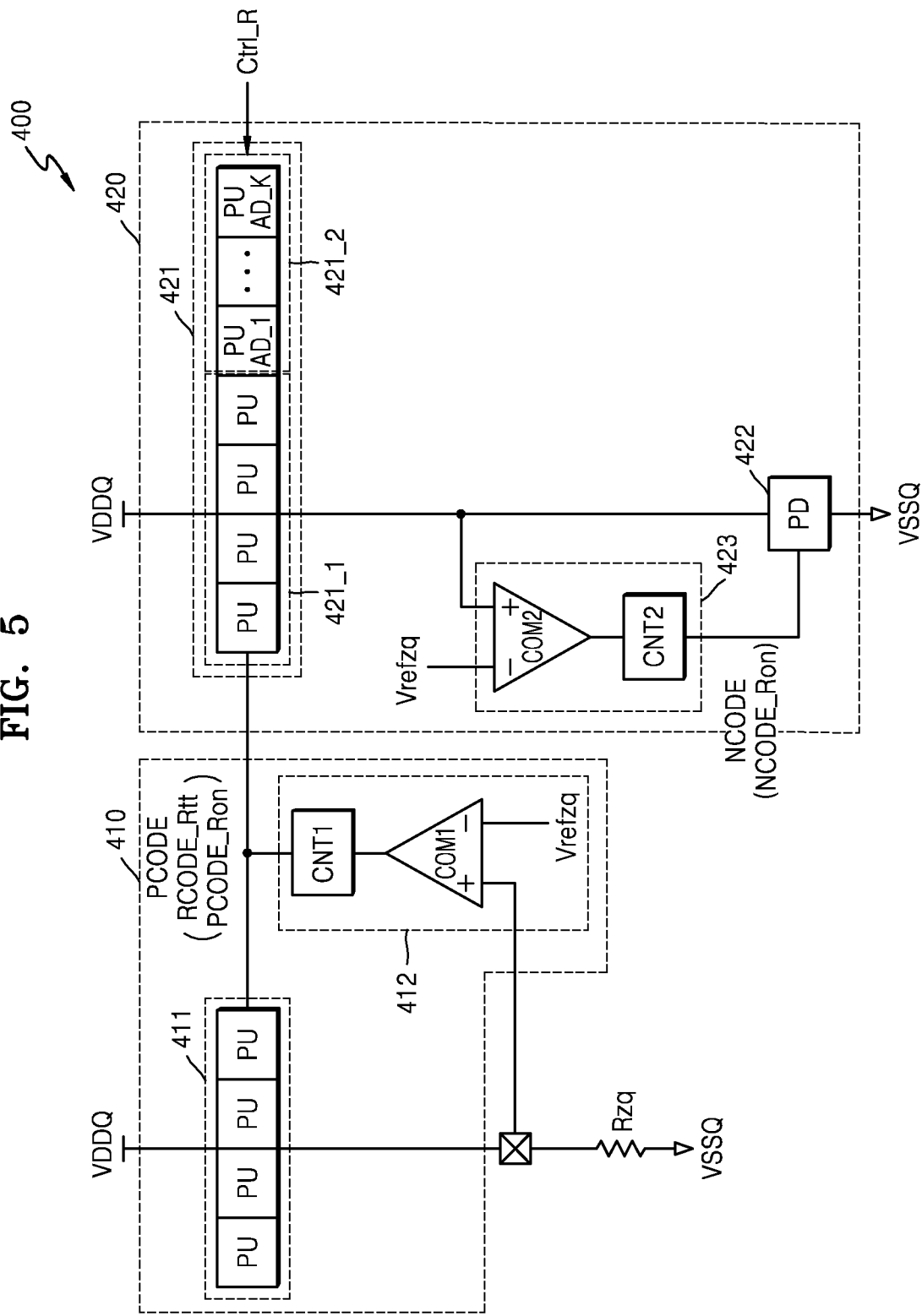
FIGS. 5 and 6 are a block diagram and a circuit diagram of a calibration circuit included in a memory device according to an exemplary embodiment of the inventive concept.
Figure 6:
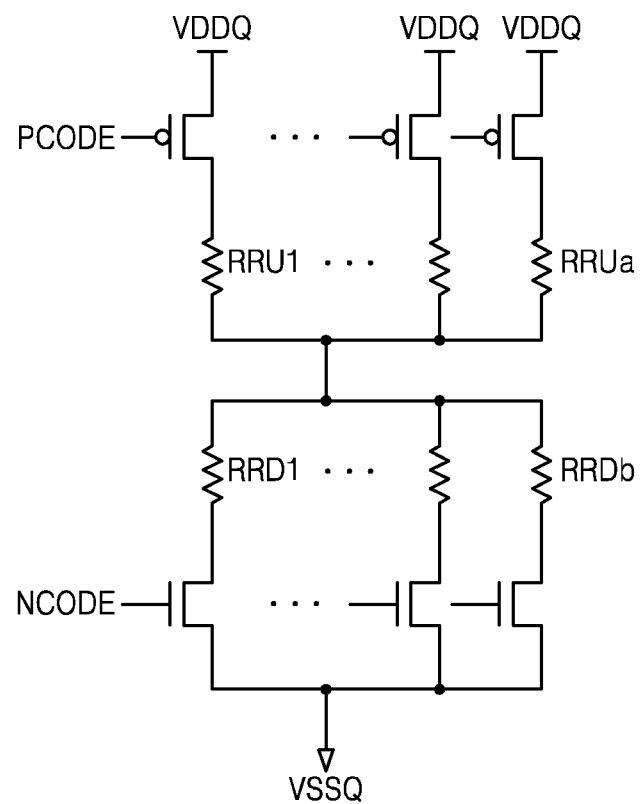

FIGS. 5 and 6 are a block diagram and a circuit diagram of a calibration circuit included in a memory device according to an exemplary embodiment of the inventive concept.

Referring to FIG. 5, a calibration circuit 400 may include a pull-up code generator 410 configured to generate a pull-up code PCODE and a pull-down code generator 420 configured to generate a pull-down code NCODE. According to the implementation example, the pull-up code generator 410 may include a pull-up resistor block 411 and a first code generator 412, and the first code generator 412 may include a first comparator COM1 and a first counter CNT1. The pull-up code generator 410 may be connected to an external calibration resistor Rzq through a pad. In addition, the pull-down code generator 420 may include a replica pull-up resistor block 421, a pull-down resistor block 422, and a second code generator 423, and the second code generator 423 may include a second comparator COM2 and a second counter CNT2.

The pull-up resistor block 411 may include one or more pull-up resistor sets PU, and in the example of FIG. 5, four pull-up resistor sets PU are illustrated, but the inventive concept is not limited thereto. In addition, the replica pull-up resistor block 421 may include first pull-up resistor sets PU (421_1) in a number corresponding to the pull-up resistor sets PU in the pull-up resistor block 411, and may further include additional pull-up resistor sets PU AD_1 to PU AD_K (421_2). In addition, the pull-down resistor block 422 may include one or more pull-down resistor sets PD, and in the example of FIG. 5, one pull-down resistor set PD is illustrated.

The pull-up resistor block 411 and the replica pull-up resistor block 421 may be connected to the power source voltage VDDQ, and the pull-down resistor block 422 may be connected to a ground voltage VSSQ. In addition, the external calibration resistor Rzq is disposed outside the memory device and has a certain resistance value, and one end of the external calibration resistor Rzq may be connected to the power source voltage VDDQ or the ground voltage VSSQ. In addition, the calibration circuit 400 may further include a reference voltage generator configured to generate a calibration reference voltage Vrefzq, and the calibration reference voltage Vrefzq may be provided to each of the first and second comparators COM1 and COM2. In the exemplary embodiment shown in FIG. 5, although an example in which the calibration reference voltage Vrefzq is commonly provided to the first and second comparators COM1 and COM2 is illustrated, the calibration circuit 400 may be implemented to generate separate reference voltages to be provided to the first and second comparators COM1 and COM2.

In a calibration operation for generating the pull-down code NCODE, at least one of the additional pull-up resistor sets PU AD_1 to PU AD_K (421_2) in the replica pull-up resistor block 421 may be further enabled in response to the enable control signal Ctrl_R, and accordingly, a resistance value of the replica pull-up resistor block 421 may be changed. Each of the pull-up resistor sets PU and the additional pull-up resistor sets PU AD_1 to PU AD_K (421_2) included in the pull-up resistor block 411 and the replica pull-up resistor block 421 may be implemented to be substantially the same as the pull-up circuit in the OCD circuit, and for example, each of the pull-up resistor sets PU and the additional pull-up resistor sets PU AD_1 to PU AD_K (421_2) may include a plurality of pull-up resistors and switches (or transistors) arranged in correspondence to the plurality of pull-up resistors.

FIG. 6 is a circuit diagram of one pull-up resistor set PU and one pull-down resistor set PD according to an exemplary embodiment of the inventive concept. In FIG. 6, the pull-up resistor set PU may correspond to an additional pull-up resistor set PU AD, e.g., as shown in FIG. 5.

The pull-up resistor set PU may include a plurality of first switches (or a plurality of PMOS transistors) connected to the power source voltage VDDQ and a plurality of pull-up resistors RRU1 to RRUa corresponding to the plurality of first switches, and the pull-down resistor set PD may include a plurality of second switches (or a plurality of NMOS transistors) connected to the ground voltage VSSQ and a plurality of pull-down resistors RRD1 to RRDb corresponding to the plurality of second switches. According to exemplary embodiments of the inventive concept, the pull-up resistor set PU may be implemented to be substantially the same as the pull-up circuit shown in FIGS. 3A and 3B, and in this case, the plurality of pull-up resistors RRU1 to RRUa may have substantially the same resistance values as the pull-up resistors RU1 to RUa of FIGS. 3A and 3B. Likewise, the pull-down resistor set PD may be implemented to be substantially the same as the pull-down circuit shown in FIGS. 3A and 3B, and in this case, the plurality of pull-down resistors RRD1 to RRDb may have substantially the same resistance values as the pull-up resistors RD1 to RDb of FIGS. 3A and 3B. In addition, according to an exemplary embodiment of the inventive concept, a resistance value of a pull-up circuit in an OCD/ODT circuit may correspond to a resistance value of one pull-up resistor set PU set in a calibration operation, and a resistance value of a pull-down circuit in the OCD/ODT circuit may correspond to a resistance value of one pull-down resistor set PD set in the calibration operation.

Referring back to FIG. 5, according to an exemplary embodiment of the inventive concept, the calibration circuit 400 may set an optimized termination resistance value of an ODT circuit and an output strength of an OCD circuit in data reception and data output processes. For example, the calibration circuit 400 may provide the pull-up code PCODE to the ODT circuit as the first pull-up code PCODE_Rtt for setting a termination resistance value and to the OCD circuit as the second pull-up code PCODE_Ron for setting a resistance value of a pull-up circuit in the OCD circuit. In addition, the calibration circuit 400 may provide the pull-down code NCODE to the OCD circuit as the pull-down code NCODE_Ron for setting a resistance value of a pull-down circuit in the OCD circuit.

A particular operation example of the calibration circuit 400 shown in FIG. 5 will now be described as follows.

In the calibration mode, the first comparator COM1 in the first code generator 412 outputs a comparison result between a voltage of one node of the pull-up resistor block 411 and the calibration reference voltage Vrefzq. The first counter CNT1 generates the pull-up code PCODE such that a resistance value of the pull-up resistor sets PU in the pull-up resistor block 411 is substantially the same as a resistance value of the external calibration resistor Rzq, based on a counting operation of the comparison result. In addition, the generated pull-up code PCODE may be stored in the memory device and thereafter provided to the OCD/ODT circuit in data reception and output operations.

In addition, to generate the pull-down code NCODE, the generated pull-up code PCODE may be provided to the replica pull-up resistor block 421, and accordingly, a resistance value of the pull-up resistor sets PU in the replica pull-up resistor block 421 may be substantially the same as the resistance value of the pull-up resistor sets PU in the pull-up resistor block 411. In this case, in an operation for generating the pull-down code NCODE, the additional pull-up resistor sets PU AD_1 to PU AD_K (421_2) are enabled, and accordingly, a total resistance value of the replica pull-up resistor block 421 is changed. For example, when the resistors in the additional pull-up resistor sets PU AD_1 to PU AD_K (421_2) are additionally connected in parallel, a resistance value of the replica pull-up resistor block 421 may decrease. In addition, the second comparator COM2 in the second code generator 423 may perform a comparison operation by receiving the calibration reference voltage Vrefzq, which is the same as that for the first comparator COM1, and generate the pull-down code NCODE such that a resistance value of the pull-down resistor block 422 is substantially the same as the resistance value of the replica pull-up resistor block 421. The generated pull-down code NCODE may be stored in the memory device and provided to the OCD circuit as the pull-down code NCODE_Ron for setting a resistance value of the pull-down circuit in the OCD circuit.

To set an output strength of the OCD circuit for a data output operation, the generated pull-up code PCODE and pull-down code NCODE may be provided to the pull-up circuit and the pull-down circuit in the OCD circuit, respectively, and the pull-up code PCODE may have a different value from that of the pull-down code NCODE. Accordingly, a resistance value of the pull-up circuit in the OCD circuit may differ from a resistance value of the pull-down circuit in the OCD circuit, and the resistance value of the pull-down circuit in the OCD circuit may decrease as compared to a case where the additional pull-up resistor sets PU AD_1 to PU AD_K (421_2) are disabled. Accordingly, when a signal output from the OCD circuit is changed to a logic low level, a slew rate of the signal may increase, and in addition, a swing level width of a data signal may increase, thus improving a read margin of data.

Although an example in which the first and second counters CNT1 and CNT2 are used to generate a pull-up code and a pull-down code is illustrated in the above-described exemplary embodiment, the inventive concept is not limited thereto. For example, a calibration circuit may be implemented by using a digital filter or the like instead of a counter.

Figure 7:
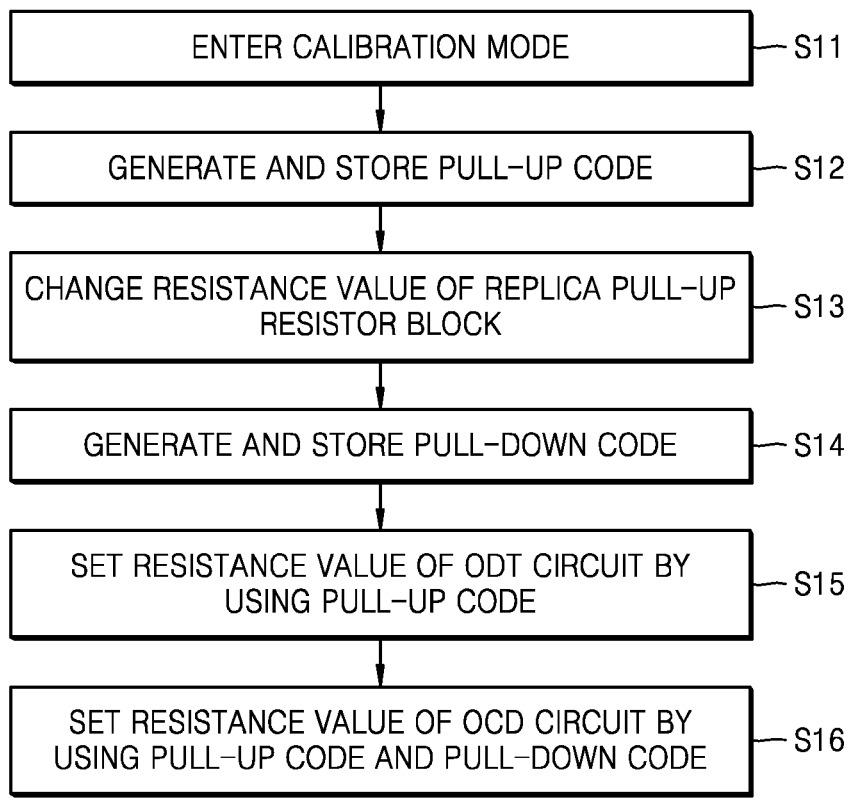
FIGS. 7 and 8 are flowcharts of operating methods of a memory device, according to exemplary embodiments of the inventive concept.

FIG. 7 is a flowchart of an operating method of a memory device, according to an exemplary embodiment of the inventive concept. In FIG. 7, it is assumed that a calibration operation includes a first calibration operation of generating the pull-up code PCODE and a second calibration operation of generating the pull-down code NCODE.

Referring to FIG. 7, the memory device may enter the calibration mode in an initial operation of a system or in response to a command from a memory controller in operation S11. A calibration circuit in the memory device may generate codes for setting a termination resistance of an ODT circuit and an output strength of an OCD circuit in the memory device during the calibration operation.

According to one operation, the calibration circuit may generate, in the first calibration operation, the pull-up code PCODE for setting the termination resistance of the ODT circuit and store the generated pull-up code PCODE in operation S12. For example, the calibration circuit may include a pull-up resistor block for generating the pull-up code PCODE and generate the pull-up code PCODE such that a resistance of the pull-up resistor block (or a pull-up resistor set in the pull-up resistor block) is substantially the same as an external calibration resistance according to the above-described exemplary embodiment. In addition, according to an exemplary embodiment of the inventive concept, the generated pull-up code PCODE may also be used to set a resistance value of a pull-up circuit in the OCD circuit and stored in a certain configuration (e.g., a register) in the memory device.

The calibration circuit may perform an operation for setting a resistance value of a pull-down circuit in the OCD circuit in the second calibration operation, and for example, the calibration circuit may change a resistance value of a replica pull-up resistor block included therein in operation S13. For example, the replica pull-up resistor block may include one or more additional pull-up resistor sets, and by enabling the one or more additional pull-up resistor sets in a process of generating the pull-down code NCODE, the resistance value of the replica pull-up resistor block may be changed. According to exemplary embodiments of the inventive concept, the additional pull-up resistor sets may be disabled in the first calibration operation and then selectively enabled in the second calibration operation, or according to exemplary embodiments of the inventive concept, the additional pull-up resistor sets may be enabled in both the first and second calibration operations.

The calibration circuit may generate the pull-down code NCODE based on a comparison result between a voltage of a node between the replica pull-up resistor block and a pull-down resistor block and a calibration reference voltage, and for example, the calibration circuit may generate the pull-down code NCODE such that a resistance value of the replica pull-up resistor block is substantially the same as a resistance value of the pull-down resistor block, in operation S14. The pull-down code NCODE may be used to set a resistance value of the pull-down circuit in the OCD circuit, and the generated pull-down code NCODE may be stored in the register in the memory device.

Thereafter, when the calibration mode ends and the memory device enters a normal mode, the pull-up code PCODE and the pull-down code NCODE may be provided to the OCD/ODT circuit. For example, the termination resistance value of the ODT circuit may be set by using the pull-up code PCODE in a data reception operation in operation S15, and the resistance value of the OCD circuit may be set by using the pull-up code PCODE and the pull-down code NCODE in a data output operation in operation S16. In addition, according to the exemplary embodiments described above, in the pull-down code NCODE generation process, the calibration operation may be performed such that the resistance value of the pull-down circuit in the OCD/ODT circuit is less than the resistance value of the pull-up circuit when the additional pull-up resistor sets are enabled, and accordingly, a signal characteristic when data is output may be improved.

Figure 8:
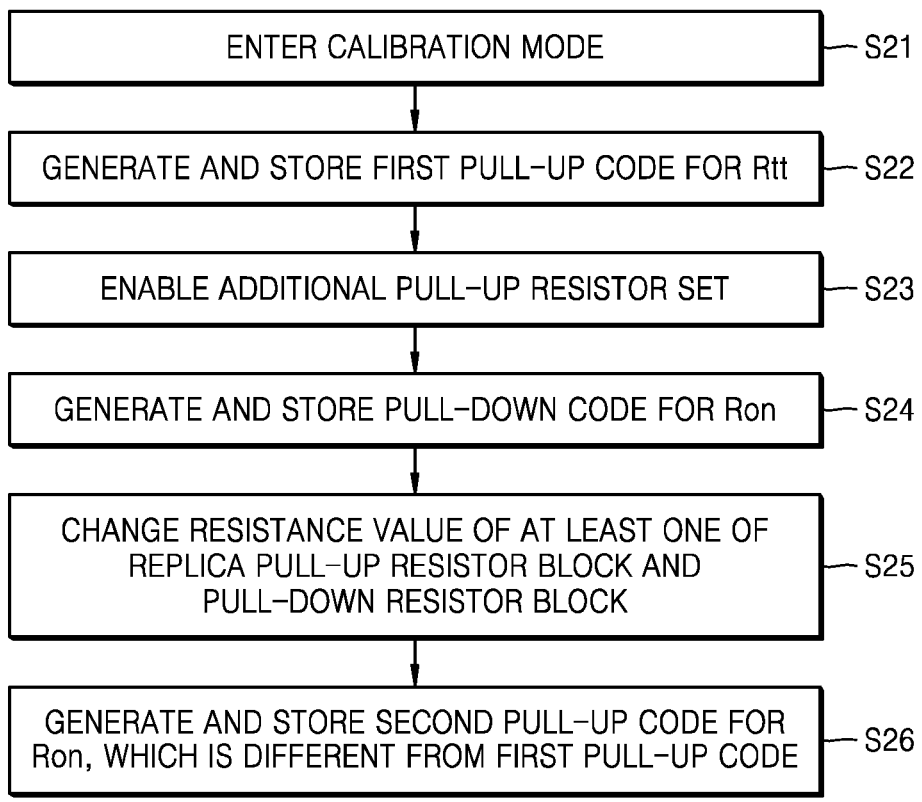

FIG. 8 is a flowchart of an operating method of a memory device, according to an exemplary embodiment of the inventive concept. FIG. 8 illustrates an example in which a calibration operation includes a first calibration operation of generating a first pull-up code for Rtt, a second calibration operation of generating a pull-down code for Ron, and a third calibration operation of generating a second pull-up code for Ron.

Referring to FIG. 8, the memory device may enter the calibration mode in an initial operation of a system or in response to a command from a memory controller in operation S21. A calibration circuit may include a pull-up resistor block, a replica pull-up resistor block, and a pull-down resistor block, and the replica pull-up resistor block may include a plurality of pull-up resistor sets. In addition, the pull-down resistor block may include one pull-down resistor set, or include a plurality of pull-down resistor sets according to exemplary embodiments of the inventive concept.

The calibration circuit may perform the first calibration operation for setting a termination resistance of an ODT circuit, and for example, according to the exemplary embodiments described above, the calibration circuit may generate the first pull-up code PCODE_Rtt for Rtt by performing a comparison operation using a voltage of one node of the pull-up resistor block connected to an external calibration resistor and a calibration reference voltage in operation S22. The generated first pull-up code PCODE_Rtt may be stored in the memory device and used when data is received.

When the second calibration operation is performed, a resistance value of the replica pull-up resistor block may be changed. For example, according to the exemplary embodiments described above, the replica pull-up resistor block may include pull-up resistor sets corresponding to those in the pull-up resistor block and further include additional pull-up resistor sets, and in the second calibration operation, the additional pull-up resistor sets may be enabled in operation S23. In addition, according to the second calibration operation, a pull-down code for Ron may be generated and stored in the memory device in operation S24. In addition, when the additional pull-up resistor sets are enabled in the second calibration operation, a resistance value of the replica pull-up resistor block may decrease, and accordingly, the pull-down code may have a code value such that a resistance value of the pull-down resistor block decreases.

When the third calibration operation is performed, a resistance value of at least one of the replica pull-up resistor block and the pull-down resistor block may be changed in operation S25. As one operation example, in the third calibration operation, the pull-down code for Ron, which has been generated prior to the third calibration operation, may be fixedly provided to the pull-down resistor block, and the second pull-up code for Ron, by which the resistance value of the replica pull-up resistor block decreases in response to a decrease in the resistance value of the pull-down resistor block, may be generated. In addition, in the third calibration operation, the resistance value of the replica pull-up resistor block may be changed by disabling the additional pull-up resistor sets in the replica pull-up resistor block, or the resistance value of the pull-down resistor block may be changed by enabling one or more additional pull-down resistor sets included in the pull-down resistor block.

In other words, in the third calibration operation, the resistance value of at least one of the replica pull-up resistor block and the pull-down resistor block may be changed as compared to the second calibration operation described above, and the second pull-up code for Ron, which differs from the first pull-up code for Rtt, may be generated and stored in the memory device in operation S26. In addition, the second pull-up code for Ron may be provided to a pull-up circuit in the OCD circuit to decrease a resistance value of the pull-up circuit in the OCD circuit. Furthermore, the second pull-up code for Ron may be generated such that the resistance value of the pull-up circuit in the OCD circuit is substantially the same as a resistance value of a pull-down circuit in the OCD circuit, and according to an exemplary embodiment of the inventive concept, the second pull-up code for Ron may have the same code value as the pull-down code for Ron.

Figure 9:
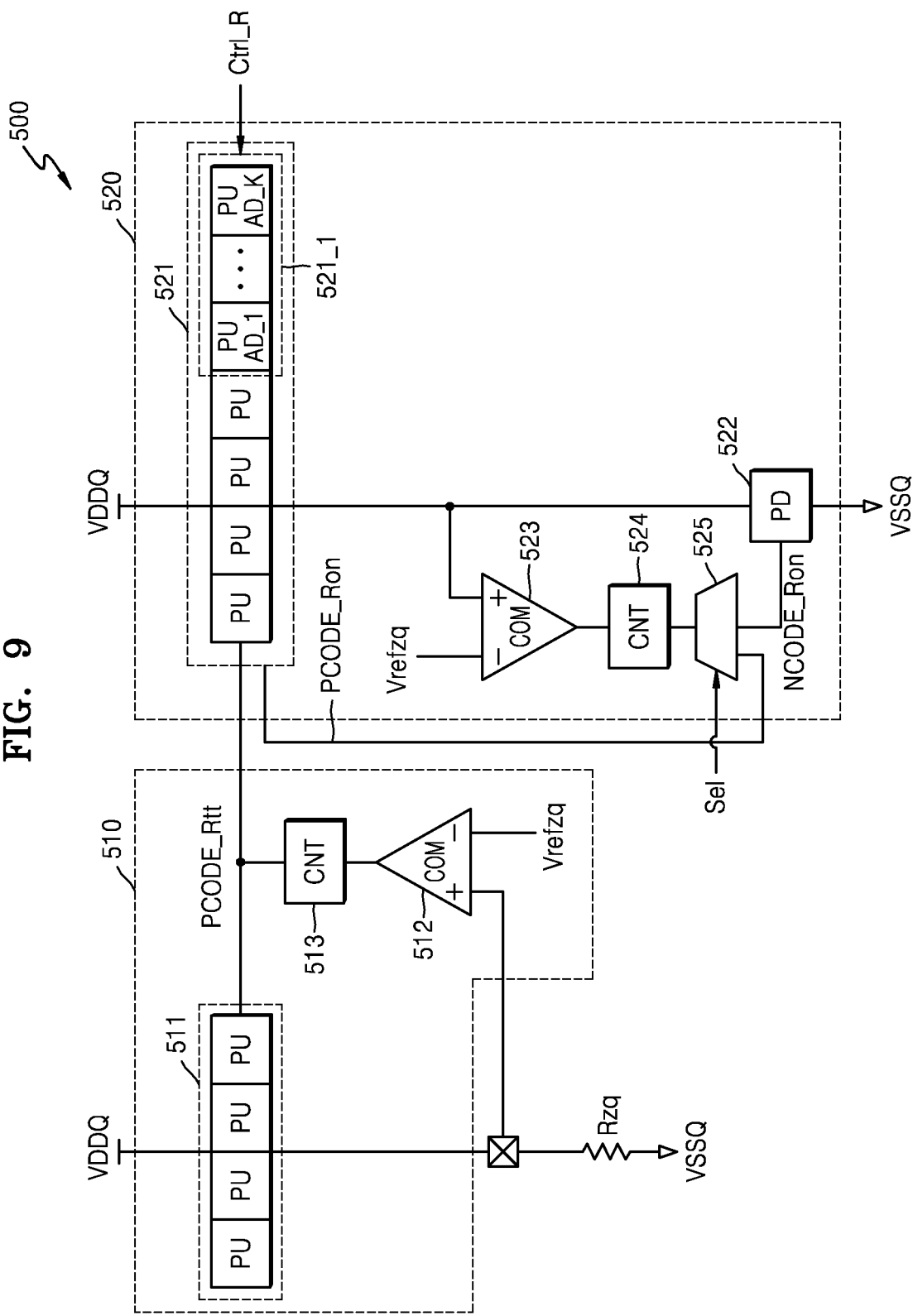
FIGS. 9 and 10 are block diagrams of a calibration circuit which performs a calibration operation according to exemplary embodiments of the inventive concept.
Figure 10:
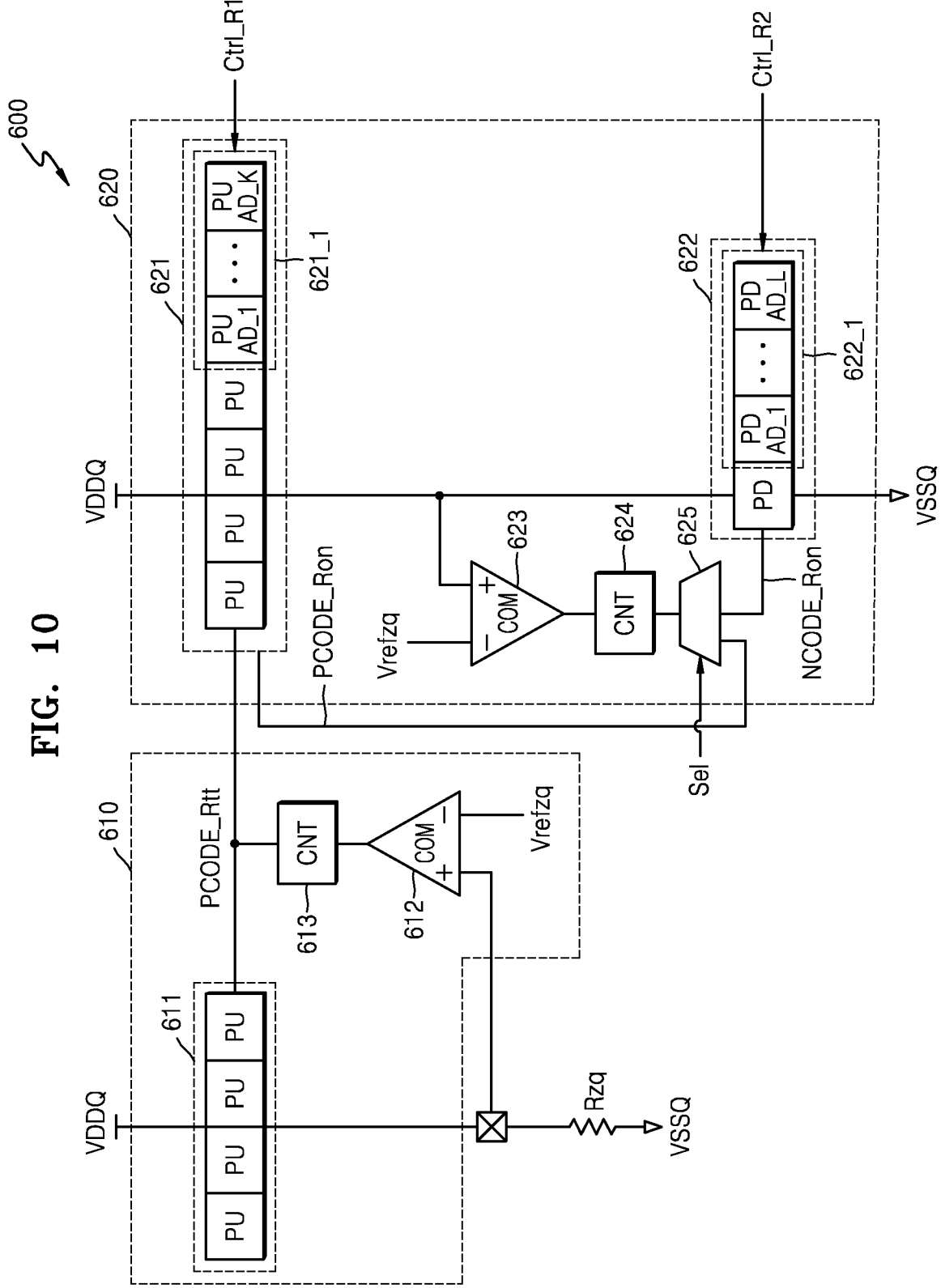

FIGS. 9 and 10 are block diagrams of a calibration circuit which performs a calibration operation according to exemplary embodiments of the inventive concept.

Referring to FIG. 9, a calibration circuit 500 may include a pull-up code generator 510 configured to generate the first pull-up code PCODE_Rtt for Rtt and a pull-down code generator 520 configured to generate the second pull-up code PCODE_Ron for Ron and the pull-down code NCODE_Ron for Ron. In addition, the pull-up code generator 510 may include a pull-up resistor block 511, a first comparator 512, and a first counter 513. The pull-down code generator 520 may include a replica pull-up resistor block 521, a pull-down resistor block 522, a second comparator 523, and a second counter 524, and may further include a selector 525. A detailed description of the same components as those in the exemplary embodiments described above is omitted herein.

According to the exemplary embodiments described above, the replica pull-up resistor block 521 may include one or more pull-up resistor sets corresponding to those in the pull-up resistor block 511, and may further include additional pull-up resistor sets PU AD_1 to PU AD_K (521_1). In the first calibration operation, the pull-up code generator 510 may generate the first pull-up code PCODE_Rtt for Rtt by comparing a voltage of a node connected to the pull-up resistor block 511 to the calibration reference voltage Vrefzq, and the generated first pull-up code PCODE_Rtt for Rtt may be fixedly stored in the memory device.

In the second calibration operation, the additional pull-up resistor sets PU AD_1 to PU AD_K (521_1) in the replica pull-up resistor block 521 are enabled in response to the enable control signal Ctrl_R. Accordingly, a resistance value of the replica pull-up resistor block 521 may be changed, and the second comparator 523 may generate the pull-down code NCODE_Ron for Ron by comparing a voltage of a node between the replica pull-up resistor block 521 and the pull-down resistor block 522 and the calibration reference voltage Vrefzq. The pull-down code NCODE_Ron for Ron, by which the resistance value of the replica pull-up resistor block 521 is substantially the same as a resistance value of the pull-down resistor block 522, may be generated, and the generated pull-down code NCODE_Ron for Ron may be fixedly stored in the memory device.

In the third calibration operation, the second pull-up code PCODE_Ron for Ron, which differs from the first pull-up code PCODE_Rtt for Rtt, may be generated, and for example, in the third calibration operation, the additional pull-up resistor sets PU AD_1 to PU AD_K (521_1) may be disabled. In addition, the selector 525 may receive an output from the second counter 524 and provide, in response to a select signal Sel from a control logic, the output from the second counter 524 to the replica pull-up resistor block 521 as the second pull-up code PCODE_Ron for Ron. When the additional pull-up resistor sets PU AD_1 to PU AD_K (521_1) in the replica pull-up resistor block 521 are disabled, a calibration operation may be performed through pull-up resistor sets PU in the replica pull-up resistor block 521 and the pull-down resistor block 522, which has a resistance value less than the external calibration resistor Rzq, and accordingly, the second pull-up code PCODE_Ron for Ron, by which a resistance value of the pull-up resistor sets PU decreases, may be generated.

FIG. 10 illustrates an example in which a pull-down resistor block includes additional pull-down resistor sets according to an exemplary embodiment of the inventive concept.

Referring to FIG. 10, a calibration circuit 600 may include a pull-up code generator 610 configured to generate the first pull-up code PCODE_Rtt for Rtt and a pull-down code generator 620 configured to generate the second pull-up code PCODE_Ron for Ron and the pull-down code NCODE_Ron for Ron. The pull-up code generator 610 may include a pull-up resistor block 611, a first comparator 612, and a first counter 613, and the pull-down code generator 620 may include a replica pull-up resistor block 621, a pull-down resistor block 622, a second comparator 623, a second counter 624, and a selector 625. In addition, the replica pull-up resistor block 621 may include additional pull-up resistor sets PU AD_1 to PU AD_K (621_1), and the pull-down resistor block 622 may include the pull-down resistor set PD, e.g., as in the exemplary embodiments described above, and may further include additional pull-down resistor sets PD AD_1 to PD AD_L (622_1).

Through the first and second calibration operations, the first pull-up code PCODE_Rtt for Rtt and the pull-down code NCODE_Ron for Ron may be generated as described in the above-described exemplary embodiments, and in the third calibration operation, the additional pull-down resistor sets PU AD_1 to PU AD_K (622_1) may be enabled in response to a second enable control signal Ctrl_R2. According to exemplary embodiments of the inventive concept, in the third calibration operation, the additional pull-up resistor sets PU AD_1 to PU AD_K (621_1) may maintain an enabled state, or the additional pull-up resistor sets PU AD_1 to PU AD_K (621_1) may be disabled in response to a first enable control signal Ctrl_R1.

In addition, the selector 625 may receive an output from the second counter 624 and provide, in response to the select signal Sel, the output from the second counter 624 to the replica pull-up resistor block 621 as the second pull-up code PCODE_Ron for Ron. In this case, when the additional pull-down resistor sets PD AD_1 to PD AD_L (622_1) are enabled, a resistance value of the pull-down resistor block 622 further decreases, and accordingly, the second pull-up code PCODE_Ron for Ron, by which a resistance value of the pull-up resistor sets PU decreases, may be generated.

Figure 11A:
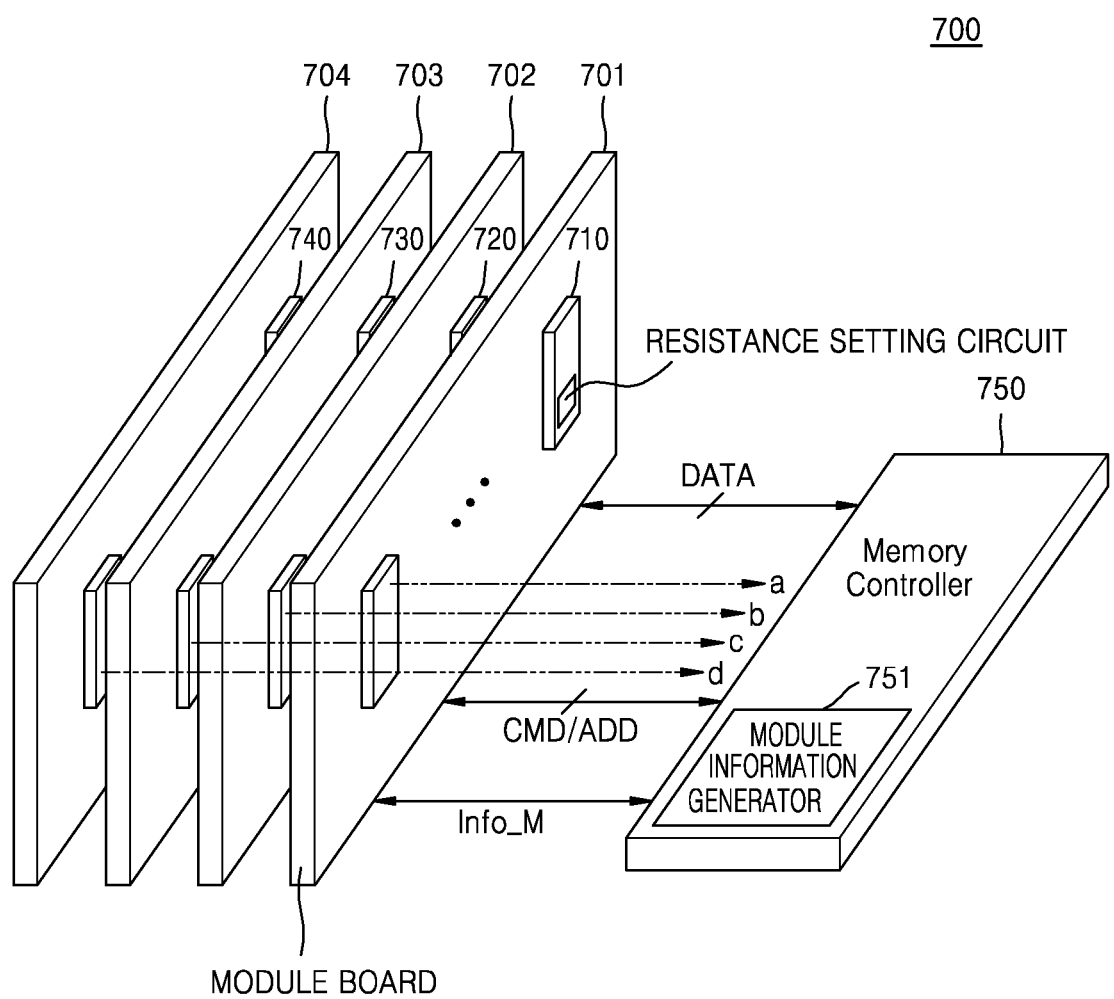
FIGS. 11A and 11B are block diagrams of a memory device and a memory system including the same, according to an exemplary embodiment of the inventive concept.
Figure 11B:
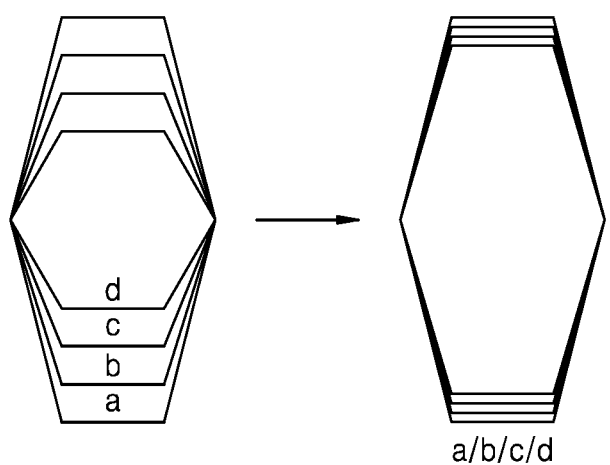

FIGS. 11A and 11B are block diagrams of a memory device and a memory system including the same, according to an exemplary embodiment of the inventive concept.

Referring to FIG. 11A, a memory system 700 may include a memory controller 750 and one or more memory modules, and FIG. 11A illustrates first to fourth memory modules 701 to 704. Each of the first to fourth memory modules 701 to 704 may include a module board on which one or more memory devices according to an exemplary embodiment of the inventive concept are mounted. The memory devices mounted on the first to fourth memory modules 701 to 704 may be referred to as first to fourth memory devices 710 to 740, respectively. According to the exemplary embodiments described above, each of the first to fourth memory devices 710 to 740 may include a resistance setting circuit.

Each of the first to fourth memory modules 701 to 704 may be implemented as a single in-line memory module (SIMM) or dual in-line memory module (DIMM) form, and when a memory module is implemented as a DIMM, a memory device may be mounted on both sides of a module board. In addition, the memory controller 750 and the first to fourth memory modules 701 to 704 may be mounted on a system board and transmit and receive the data DATA and the command CMD/address ADD through a wiring on the system board.

The memory devices provided to the memory system 700 may form a plurality of ranks. For example, it may be defined that memory devices mounted on different memory modules are included in different ranks. Alternatively, it may be defined that a memory device mounted on one surface of a module board and a memory device mounted on the other surface of the module board among memory devices mounted on a memory module are included in different ranks.

In the system board, locations where the first to fourth memory modules 701 to 704 are mounted differ from one another, and accordingly, memory devices in different ranks may transmit and receive the data DATA to and from the memory controller 750 through different physical distances (e.g., a through d). Resistances of data transmission paths between the first to fourth memory modules 701 to 704 and the memory controller 750 may differ from one another. For example, a physical distance (e.g., a) between the first memory module 701 and the memory controller 750 may be relatively short, whereas a physical distance (e.g., d) between the fourth memory module 704 and the memory controller 750 may be relatively long. Accordingly, the first to fourth memory devices 710 to 740 mounted on the first to fourth memory modules 701 to 704 may have different eye window characteristics, thus causing a read margin to decrease.

According to an exemplary embodiment of the inventive concept, the memory controller 750 may include a module information generator 751, and the module information generator 751 may provide module information Info_M to the first to fourth memory modules 701 to 704. Each of the first to fourth memory devices 710 to 740 mounted on the first to fourth memory modules 701 to 704, respectively, may perform the calibration operation according to the exemplary embodiments described above, based on the module information Info_M. For example, by providing pieces of the module information Info_M having different values to the first to fourth memory modules 701 to 704, each calibration circuit in the first to fourth memory devices 710 to 740 may set a different resistance value therein to generate a pull-up code and a pull-down code. According to the exemplary embodiments described above, each calibration circuit may include a plurality of pull-up resistor sets and/or pull-down resistor sets, and the number of resistor sets enabled in the first to fourth memory modules 701 to 704 may be different from one another. Accordingly, the first memory device 710 of the first memory module 701 having a relatively short distance may be set with a low output strength of an OCD circuit therein, whereas the fourth memory device 740 of the fourth memory module 704 may be set with a relatively high output strength of an OCD circuit therein.

FIG. 11B illustrates an example of an eye window of data DATA output from the first to fourth memory modules 701 to 704, according to an exemplary embodiment of the inventive concept. For example, when output strengths of OCD circuits in the first to fourth memory modules 701 to 704 are identical to one another, there may be an eye window characteristic where a signal swing width of the data DATA from the first memory module 701 located at a relatively short distance from the memory controller 750 is relatively large, whereas a signal swing width of the data DATA from the fourth memory module 704 is relatively small. On the contrary, according to exemplary embodiments of the inventive concept, the fourth memory device 740 of the fourth memory module 704 may be set to have a resistance value of the OCD circuit therein which is less than a resistance value of the OCD circuit in the first memory device 710 of the first memory module 701 through a calibration operation, and accordingly, signal swing widths from the first to fourth memory modules 701 to 704 may be the same or have similar values.

Figure 12:
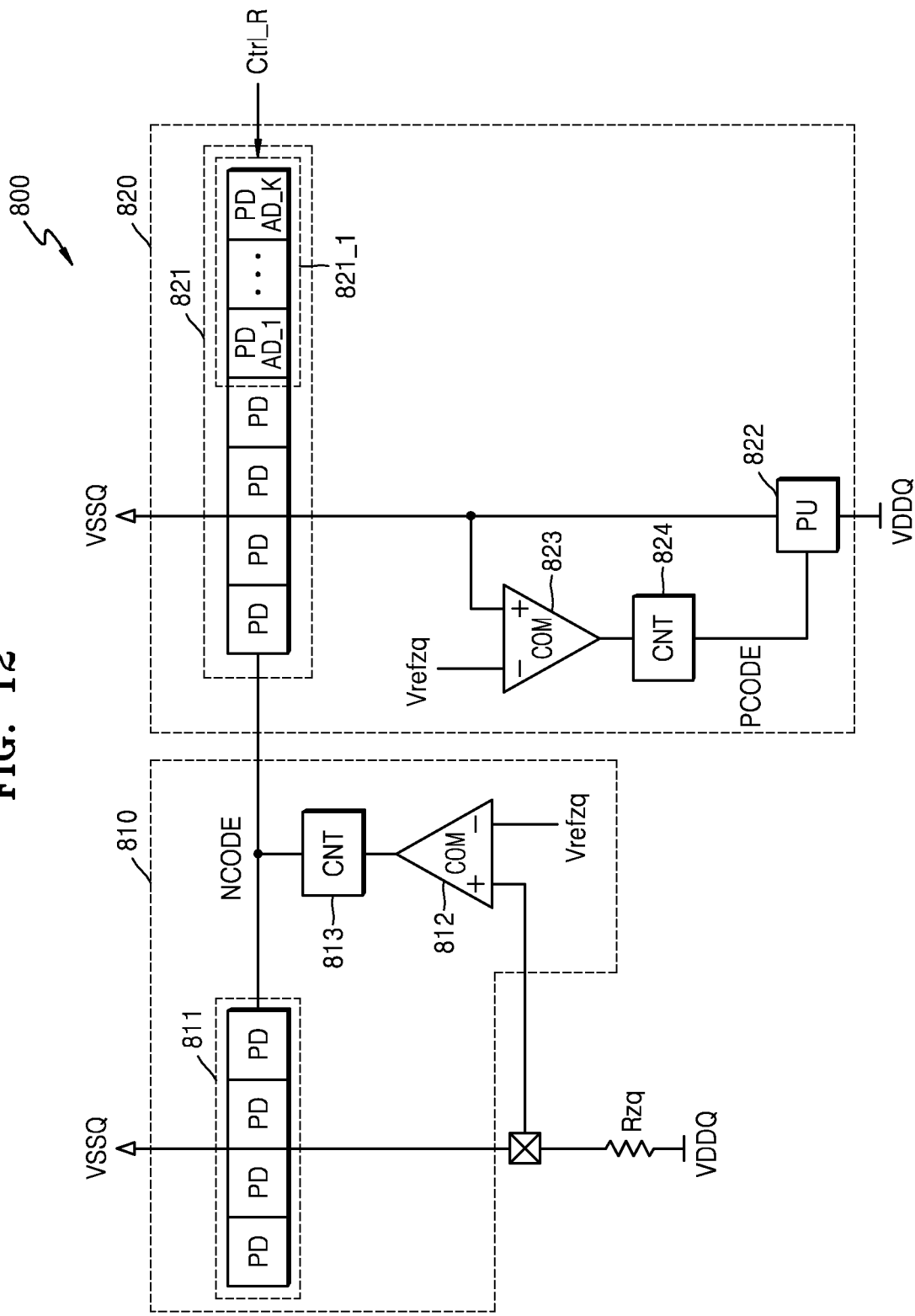
FIG. 12 is a block diagram of a calibration circuit according to an exemplary embodiment of the inventive concept.

FIG. 12 is a block diagram of a calibration circuit according to an exemplary embodiment of the inventive concept. FIG. 12 illustrates an example in which a pull-down resistor block is connected to the external calibration resistor Rzq.

Referring to FIG. 12, a calibration circuit 800 may include a pull-down code generator 810 configured to generate the pull-down code NCODE and a pull-up code generator 820 configured to generate the pull-up code PCODE, and the pull-down code generator 810 may include a pull-down resistor block 811, a first comparator 812, and a first counter 813. In addition, the pull-up code generator 820 may include a replica pull-down resistor block 821, a pull-up resistor block 822, a second comparator 823, and a second counter 824. The pull-down resistor block 811 may include one or more pull-down resistor sets PD, the pull-up resistor block 822 may include one or more pull-up resistor sets PU, each pull-down resistor set PD may be implemented to be substantially the same as a pull-down circuit in an OCD/ODT circuit, and each pull-up resistor set PU may be implemented to be substantially the same as a pull-up circuit in the OCD/ODT circuit. In addition, the replica pull-down resistor block 821 may include pull-down resistor sets PD corresponding to those in the pull-down resistor block 811, and may further include additional pull-down resistor sets PD AD_1 to PD AD_K (821_1).

Similarly to the exemplary embodiments described above, the pull-down code NCODE generated by the pull-down code generator 810 may be provided to the replica pull-down resistor block 821, and in a process of generating the pull-up code PCODE, the additional pull-down resistor sets PD AD_1 to PD AD_K (821_1) may be enabled in response to the enable control signal Ctrl_R. When the additional pull-down resistor sets PD AD_1 to PD AD_K (821_1) are enabled, a resistance value of the replica pull-down resistor block 821 may decrease, and accordingly, the pull-up code PCODE may have a code value by which a resistance value of the pull-up resistor block 822 decreases. In addition, when the generated pull-up code PCODE is provided to the pull-up circuit in the OCD circuit, a resistance value of the pull-up circuit in the OCD circuit may decrease, and a slew rate of a data signal to a logic high level may be improved, thus improving a read margin.

Although an example in which the resistance value of the pull-up circuit in the OCD circuit decreases is illustrated in the exemplary embodiment shown in FIG. 12, the inventive concept is not limited thereto. For example, in a same or similar manner as the exemplary embodiments described above, a pull-down code for Ron may be separately generated, and in a process of generating the pull-down code for Ron, the resistance value of the pull-up circuit in the OCD circuit may decrease through a method of disabling the additional pull-down resistor sets PD AD_1 to PD AD_K (821_1) or enabling additional pull-up resistor sets included in the pull-up resistor block 822.

Figure 13:
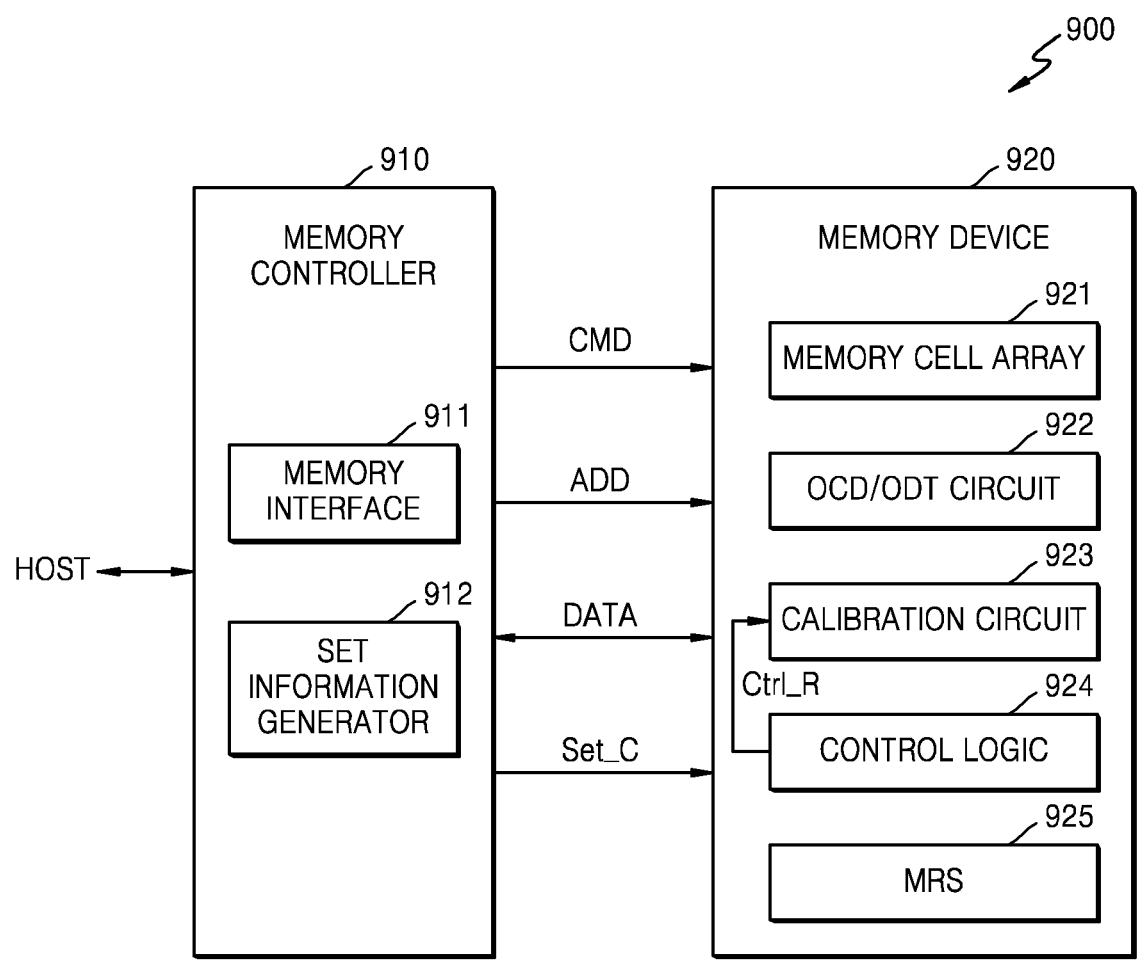
FIG. 13 is a block diagram of a memory system according to an exemplary embodiment of the inventive concept.

FIG. 13 is a block diagram of a memory system according to an exemplary embodiment of the inventive concept.

A memory system 900 may include a memory controller 910 and a memory device 920, and the memory controller 910 may include a memory interface 911 and a setting information generator 912. In addition, the memory device 920 may include a memory cell array 921, an OCD/ODT circuit 922, a calibration circuit 923, a control logic 924, and a mode register set (MRS) 925. The command CMD, the address ADD, and the data DATA may be transmitted and received between the memory controller 910 and the memory device 920, and the setting information generator 912 may provide, to the memory device 920, setting information Set_C for setting a resistance value of the OCD/ODT circuit 922.

According to exemplary embodiments of the inventive concept, the memory controller 910 may be included in an application processor, and the application processor may perform a function of a host. In addition, the application processor may include an intellectual property block configured to perform a modem function, and in this case, the application processor may be referred to as ModAP.

According to the exemplary embodiments described above, a resistance value of the OCD/ODT circuit 922 (e.g., resistance values of a pull-up circuit and a pull-down circuit) may be adjusted by the setting information Set_C from the memory controller 910, and the setting information Set_C may be stored in the MRS 925 in the memory device 920. The setting information Set_C may be generated by various methods, and for example, in an initial operation of the memory system 900, the memory controller 910 may test the characteristics of a signal provided from the memory device 920 and provide the setting information Set_C to the memory device 920 to adjust the signal characteristics of the memory device 920. Alternatively, the memory controller 910 may provide the setting information Set_C of which a value varies according to a location where the memory device 920 is mounted on a module board or a system board.

The control logic 924 may decode the setting information Set_C stored in the MRS 925 and provide the enable control signal Ctrl_R, according to the exemplary embodiments described above, to the calibration circuit 923 based on the decoding result. The calibration circuit 923 may include the pull-up resistor set and the pull-down resistor set according to the exemplary embodiments described above, and may further include an additional pull-up (or pull-down) resistor set. In addition, the calibration circuit 923 may perform a plurality of calibration operations and adjust the resistance value of the OCD/ODT circuit 922 by controlling the enabling of the additional pull-up (or pull-down) resistor set in at least some calibration operations.

While the inventive concept has been particularly shown and described with reference to exemplary embodiments thereof, it will be understood by those of ordinary skill in the art that various changes in form and details may be made thereto without departing from the spirit and scope of the following claims.

What is claimed is:
1. A memory device comprising:
a calibration circuit having a pull-up code generator comprising a pull-up resistor block and configured to generate a pull-up code, and a pull-down code generator comprising a replica pull-up resistor block and a pull-down resistor block and configured to generate a pull-down code; and
an off chip driver (OCD)/on die termination (ODT) circuit configured to provide a termination resistance having a resistance value set by the calibration circuit in a data reception operation and to output data at an output strength set by the calibration circuit in a data output operation,
wherein, in a calibration operation, a resistance value of the replica pull-up resistor block is adjusted to be less than a resistance value of the pull-up resistor block, and the pull-down code has a code value by which a resistance value of the pull-down resistor block corresponds to the resistance value of the replica pull-up resistor block.
2. The memory device of claim 1, wherein
the pull-up resistor block comprises at least one pull-up resistor set connected to a power source voltage, the replica pull-up resistor block comprises a first pull-up resistor set corresponding to that in the pull-up resistor block and an additional pull-up resistor set, and the first pull-up resistor set and the additional pull-up resistor set are connected to the power source voltage and arranged in parallel to each other, and
in the calibration operation, when the additional pull-up resistor set is enabled, the resistance value of the replica pull-up resistor block is adjusted to be less than the resistance value of the pull-up resistor block.
3. The memory device of claim 2, wherein
the replica pull-up resistor block comprises a plurality of additional pull-up resistor sets, and
in the calibration operation, as the number of the plurality of additional pull-up resistor sets enabled increases, the resistance value of the pull-down resistor block decreases.
4. The memory device of claim 3, wherein
the memory device receives control information related to the output strength from a memory controller, and
the number of the plurality of additional pull-up resistor sets enabled is adjusted according to the control information.
5. The memory device of claim 1, wherein
the OCD/ODT circuit comprises a pull-up circuit and a pull-down circuit, the pull-up circuit comprises a plurality of first switches configured to be switched in response to the pull-up code and a plurality of pull-up resistors arranged in correspondence to the plurality of first switches, and the pull-down circuit comprises a plurality of second switches configured to be switched in response to the pull-down code and a plurality of pull-down resistors arranged in correspondence to the plurality of second switches, and according to code values of the pull-up code and the pull-down code, the pull-up circuit and the pull-down circuit in the OCD/ODT circuit have different resistance values.

6. The memory device of claim 5, wherein,
in the data output operation, the resistance value of the pull-down circuit in the OCD/ODT circuit is less than the resistance value of the pull-up circuit in the OCD/ODT circuit.

7. The memory device of claim 5, wherein,
in the data reception operation, the plurality of second switches are turned off, and the plurality of first switches have a turn-on state corresponding to the code value of the pull-up code, to provide the termination resistance.

8. The memory device of claim 1, wherein
the pull-up resistor block is connected to an external calibration resistor through a pad, and
the pull-up code generator comprises:
a first comparator configured to perform a comparison operation by connecting a first input end thereof to one node of the pull-up resistor block and connecting a second input end thereof to a calibration reference voltage; and
a first counter configured to generate the pull-up code based on a counting operation on a comparison result from the first comparator.

9. The memory device of claim 8, wherein the pull-down code generator comprises:
a second comparator configured to perform a comparison operation by connecting a first input end thereof to a node between the replica pull-up resistor block and the pull-down resistor block and connecting a second input end thereof to the calibration reference voltage; and
a second counter configured to generate the pull-down code based on a counting operation on a comparison result from the second comparator.

10. The memory device of claim 1, wherein
the OCD/ODT circuit comprises a pull-up circuit and a pull-down circuit,
the pull-up code corresponds to a first pull-up code provided to the pull-up circuit in the OCD/ODT circuit in the data reception operation,
the calibration circuit performs first and second calibration operations,
in the first calibration operation, the pull-down code generator generates the pull-down code as a code provided to the pull-down circuit in the OCD/ODT circuit in the data output operation,
in the second calibration operation, the pull-down code generator further generates a second pull-up code provided to the pull-up circuit in the OCD/ODT circuit in the data output operation, and
the first pull-up code and the second pull-up code have different code values.

11. The memory device of claim 10, wherein
the pull-up resistor block comprises at least one pull-up resistor set connected to a power source voltage, the replica pull-up resistor block comprises a first pull-up resistor set corresponding to that in the pull-up resistor block and an additional pull-up resistor set, and the first pull-up resistor set and the additional pull-up resistor set are connected to the power source voltage and arranged in parallel to each other, and in the first calibration operation, the additional pull-up resistor set is enabled, and in the second calibration operation, the additional pull-up resistor set is disabled.

12. The memory device of claim 11, wherein
the pull-up circuit in the OCD/ODT circuit has a resistance value varying in response to the second pull-up code in the data output operation,
the pull-down circuit in the OCD/ODT circuit has a resistance value varying in response to the pull-down code, and
in the data output operation, the pull-up circuit and the pull-down circuit in the OCD/ODT circuit have substantially the same resistance value.

13. A calibration circuit configured to control an off chip driver (OCD)/on die termination (ODT) circuit, the calibration circuit comprising:
a pull-up resistor block connected to an external calibration resistor through a pad and comprising at least one pull-up resistor set each connected to a power source voltage;
a first code generator configured to generate a pull-up code for controlling a pull-up circuit in the OCD/ODT circuit, based on a comparison operation comparing a voltage of one node of the pull-up resistor block and a calibration reference voltage;
a replica pull-up resistor block comprising a plurality of pull-up resistor sets connected to the power source voltage;
a pull-down resistor block comprising a pull-down resistor set connected to a ground voltage; and
a second code generator configured to generate a pull-down code for controlling a pull-down circuit in the OCD/ODT circuit, based on a comparison operation comparing a voltage of a node between the replica pull-up resistor block and the pull-down resistor block and the calibration reference voltage,
wherein, in a calibration operation, when a number of enabled pull-up resistor sets in the pull-up resistor block differs from a number of enabled pull-up resistor sets in the replica pull-up resistor block, the pull-up code and the pull-down code have code values by which the pull-up circuit and the pull-down circuit in the OCD/ODT circuit are set to have different resistance values.

14. The calibration circuit of claim 13, wherein,
in the calibration operation, when the number of enabled pull-up resistor sets in the replica pull-up resistor block is greater than the number of enabled pull-up resistor sets in the pull-up resistor block, a resistance value of the replica pull-up resistor block is adjusted to be less than a resistance value of the pull-up resistor block.

15. The calibration circuit of claim 14, wherein,
when the resistance value of the replica pull-up resistor block is adjusted to be less than the resistance value of the pull-up resistor block, a resistance value of the pull-down resistor block is calibrated to be less than a resistance value of the external calibration resistor.

16. The calibration circuit of claim 14, wherein
the pull-up code and the pull-down code have code values for setting a resistance value of the pull-down circuit in the OCD/ODT circuit to be less than a resistance value of the pull-up circuit in the OCD/ODT circuit.

17. An operating method of a memory device, the operating method comprising:
entering a calibration mode;
generating a pull-up code such that a resistance value of a pull-up resistor block has a value corresponding to an external calibration resistor, through a pull-up code generator connected to the external calibration resistor and the pull-up resistor block during a first calibration operation;

generating a pull-down code such that a resistance value of a pull-down resistor block has a value corresponding to a resistance value of a replica pull-up resistor block which receives the pull-up code, through a pull-down code generator connected to a node between the replica pull-up resistor block and the pull-down resistor block during a second calibration operation, wherein when the resistance value of the replica pull-up resistor block is adjusted to be less than the resistance value of the pull-up resistor block, a resistance value of the pull-down circuit in the OCD/ODT circuit is adjusted to be less than a resistance value of the pull-up circuit in the OCD/ODT circuit; and providing the pull-up code and the pull-down code to a pull-up circuit and a pull-down circuit, respectively, in an off chip driver (OCD)/on die termination (ODT) circuit, after the calibration mode ends, wherein a code value of the pull-down code varies according to a change in the resistance value of the replica pull-up resistor block.

18. The operating method of claim 17, wherein the pull-up resistor block comprises one or more pull-up resistor sets, and the replica pull-up resistor block comprises a plurality of pull-up resistor sets, and during the second calibration operation, a number of enabled pull-up resistor sets in the replica pull-up resistor block is greater than a number of enabled pull-up resistor sets in the pull-up resistor block.

19. The operating method of claim 18, further comprising receiving control information from a memory controller, wherein, during the second calibration operation, the number of enabled pull-up resistor sets in the replica pull-up resistor block is adjusted according to the control information.

* * * * *